United States Patent
Patelmo et al.

(10) Patent No.: US 6,521,957 B2
(45) Date of Patent: Feb. 18, 2003

(54) METHOD FOR FORMING A MULTILEVEL ROM MEMORY IN A DUAL GATE CMOS PROCESS, AND CORRESPONDING ROM MEMORY CELL

(75) Inventors: Matteo Patelmo, Bernareggio (IT); Giovanna Dalla Libera, Monza (IT); Nadia Galbiati, Seregno (IT); Bruno Vajana, Bergamo (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/733,499

(22) Filed: Dec. 7, 2000

(65) Prior Publication Data

US 2001/0001721 A1 May 24, 2001

Related U.S. Application Data

(62) Division of application No. 09/411,138, filed on Oct. 1, 1999, now Pat. No. 6,177,313.

(30) Foreign Application Priority Data

Oct. 2, 1998 (EP) .............................. 98830583

(51) Int. Cl.[7] .................. H01L 29/76; H01L 29/94; H01L 31/113
(52) U.S. Cl. ............... 257/390; 257/391; 257/392; 257/368
(58) Field of Search ................ 257/390, 391, 257/392, 393, 368; 438/210, 232, 128–130

(56) References Cited

U.S. PATENT DOCUMENTS

| | | |
|---|---|---|
| 5,227,326 A | 7/1993 | Walker .................... 437/52 |
| 5,468,666 A | 11/1995 | Chapman .................... 437/44 |
| 5,504,030 A | 4/1996 | Chung et al. .................. 437/52 |
| 5,541,876 A | 7/1996 | Hsue et al. .................. 365/178 |
| 5,780,330 A * | 7/1998 | Choi .......................... 438/232 |
| 5,793,086 A | 8/1998 | Ghio et al. ................. 257/390 |
| 5,822,243 A | 10/1998 | Shone ................... 365/185.08 |
| 5,844,839 A * | 12/1998 | Smayling et al. ....... 365/185.23 |
| 6,177,313 B1 | 1/2001 | Patelmo et al. ............. 438/257 |
| 6,191,460 B1 * | 2/2001 | Choi et al. .................. 257/391 |

FOREIGN PATENT DOCUMENTS

| | | |
|---|---|---|
| EP | 0 627 742 A2 | 12/1994 |
| EP | 0 661 751 A1 | 7/1995 |
| EP | 0 890 985 A1 | 1/1999 |
| EP | 0 991 118 A1 | 4/2000 |
| JP | 3-177065 | 8/1991 |
| JP | 9-232449 | 9/1997 |

OTHER PUBLICATIONS

Hart, M. et al., "A Back–Biased 0.65 $\mu m$ Leffn CMOS EEPROM Technology for Next–Generation Sub 7 ns Programmable Logic Devices," *Microelectronic Engineering,* 15(1/4):pp. 613–616, Oct. 1991.

* cited by examiner

Primary Examiner—Olik Chaudhuri
Assistant Examiner—Dilinh Nguyen
(74) *Attorney, Agent, or Firm*—Lisa K. Jorgenson; Robert Iannucci; Seed Intellectual Property Law Group PLLC

(57) ABSTRACT

The invention relates to a method of producing a multi-level memory of the ROM type in a CMOS process of the dual gate type. Specifically, some of the transistors of the ROM cells have their polysilicon layers masked and the ROM cells are then implanted by a first dopant species in the active areas of the exposed transistors. Then the masks are removed from the polysilicon layer, and a second dopant species is implanted in said previously covered layer.

7 Claims, 3 Drawing Sheets

METHOD FOR FORMING A MULTILEVEL ROM MEMORY IN A DUAL GATE CMOS PROCESS, AND CORRESPONDING ROM MEMORY CELL

CROSS-REFERENCE TO RELATED APPLICATION

This application is a divisional of U.S. patent application No. 09/411,138, filed Oct. 1, 1999, now U.S. Pat. No. 6,177,313.

TECHNICAL FIELD

This invention relates to a method of producing a multi-level dual-gate ROM type memory in a CMOS process, and to a memory cell structure produced thereby.

The invention also relates to a ROM structure, with transistor cells integrated in a semiconductor by a dual gate CMOS process along with electrically erasable non-volatile memory cells and low- and high-voltage transistors, with all the cells and transistors having active areas covered with a layer of gate oxide, in turn overlaid by a polysilicon layer.

BACKGROUND OF THE INVENTION

As is well known in this specific technical field, there exists a growing demand from the market, and especially from the smart card market, for integration in a single semiconductor electronic device of both ROM (Read Only Memory) circuits and non-volatile, but electrically erasable, memories such as EEPROMs and/or Flash EEPROMs. Filling this demand calls for a significantly more complicated manufacturing process than a process used to create only a single one of these memories, as the technologies involved in providing either circuit types are not fully compatible. Accordingly, production costs become higher, and achieving high yield rates is made more difficult. In addition, continuing advances in cryptographic techniques require the use of codes of increasing size, in terms of number of bits, which are not easily decrypted by reverse engineering methods.

It is also recognized that an array of ROM cells is essentially an array of MOS transistors having conventional source, drain, and gate terminals, and threshold voltages which are set during their fabrication process. The threshold is also differentiated such that, for any given bias of the transistor gate terminal, it becomes possible to determine which cells are in the 'on' (logic 1) state and which are instead in the 'off' (logic 0) state by means of a suitable sensing circuit. Telling which cells are in the logic 1 state and which are in the logic 0 state is usually achieved by implanting or not implanting the source and drain junctions during the step of implanting these transistor regions.

This prior approach provides cells with a logic value of 1 and/or 0, without a preliminary optical analysis enabling them to be discerned. Other approaches allow the logic value of 1 or 0 to be determined based on the presence or absence of a transistor.

There is no current technology available which can provide a multi-level ROM structure, that is, a structure which can store several logic values in each memory cell.

SUMMARY OF THE INVENTION

A method of producing a multi-level type of ROM in a CMOS process of the dual-gate type is presented, thereby expanding the information storage capacity by means of a readily integratable component with CMOS technology.

Embodiments of this invention provide a ROM type of memory cell which can store at least three discrete logic levels. Such a cell is obtained by two different dopings of the polysilicon layer that forms the gate region of the transistor. The step of implanting the source/drain regions of the transistor which comprises the cell is, therefore, substantially separated from the polysilicon implanting step.

Based on this concept, a memory device and a method of producing the multi-level memory of the ROM type in a CMOS process of the dual gate type is presented. First, on a semiconductor substrate, active areas for transistors including ROM cells, electrically erasable non-volatile memory cells, and low- and high- voltage transistors are created. Oxide and polysilicon layers are deposited over the semiconductor. The polysilicon layer is masked and etched to define respective gate regions of the ROM cells, non-volatile cells, and low- and high-voltage transistors. The polysilicon layer of some of the transistors of the ROM cells is masked and the substrate implanted by a dopant in the active areas of the exposed transistors. The mask is then removed, and a second dopant species is implanted in the semiconductor in areas previously covered by the mask. Finally, the polysilicon layer is masked and subsequently etched to define the gate regions of the ROM cell transistors.

DETAILED DESCRIPTION

The process steps and structures described herein below do not reflect a complete process flow for manufacturing integrated circuits. The present invention can be practiced in combination with state-of-art techniques as currently employed in the manufacture of integrated circuits. Explanation of well-known steps has been omitted for brevity.

Figure 1:
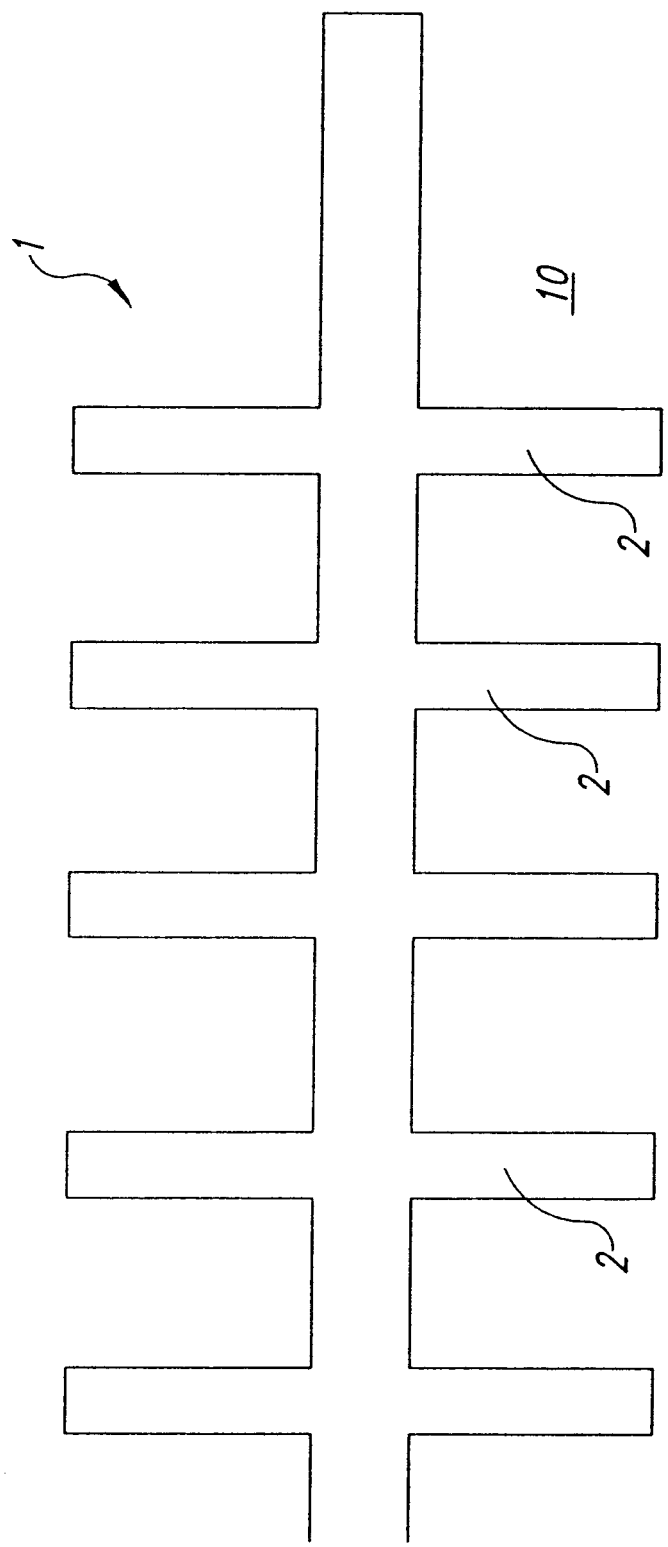
FIG. 1 is a layout view of a portion of a semiconductor integrated circuit which incorporates at least one ROM cell formed in accordance with embodiments of this invention.

Referring in particular to FIG. 1, steps of a first embodiment which lead to forming multi-level ROM cells in a CMOS process of the dual gate type will now be described.

In CMOS processes of the latest generation, MOS transistors are usually formed with their gate regions doped with the same dopant type as the channel region, and it is to this feature that the term "dual gate" applies in technical language. To this aim, it is necessary for the gate region to be left unprotected during the process step which provides heavy source drain implants.

Advantageously in embodiments of this invention, the memory circuit that incorporates the ROM cells 1 is integrated in a semiconductor together with a memory circuit of a different type incorporating electrically erasable non-volatile cells of the EEPROM or Flash EEPROM type. Circuitry is also associated with the matrix of memory cells including both low-voltage (LV) MOS transistors and high-voltage (HV) MOS transistors.

The source and drain junctions of low-voltage MOS transistors are usually formed with a gentle profile by a double dopant implantation referred to as LDD (Lightly Doped Drain) implantation.

In the integrated memory circuit of embodiments of this invention, the HV transistors are needed for handling high (>12V) voltages during the step of programming the non-volatile memory cells. During the heavy source and drain implanting step applied to the LV transistors, the HV transistors are wholly masked off. The heavy implantation is only carried out in contact regions, to ensure good contacting.

Reference will be made to an instance of the memory cells being N-channel cells, although the same considerations would also apply to P-channel cells once all dopant types are reversed.

First defined on a semiconductor substrate 10 are the active areas of the various transistors which comprise the memory circuits described hereinabove. Thus, both the active areas of the ROM cells 1 and the active area of the non-volatile memory cells forming the Flash EEPROM circuit portion are defined. In addition, low- and high-voltage MOS transistors of the circuitry associated with the cell matrix are formed.

For example, active areas 2 are defined for the transistors of the ROM cells, as shown in FIG. 1. Of course, there would be one transistor for each active area. The active areas 2 are T-shaped. Shown in FIG. 1 are an arbitrary number of adjacent cells, each having a respective active area 2. Grown on top of the active areas 2 is a thin layer of gate oxide (not shown because conventional). This step implies oxidation of the whole memory circuitry. At this stage, a layer of polysilicon, as required for forming the gate regions of the memory cell transistors, is deposited (not shown because conventional).

Conventional masking, etching, flushing, and implanting steps enable definition of the standard low-voltage MOS transistors with source and drain junctions of the LDD type. These steps lead to the definition of the polysilicon layer, and are preliminary to the LDD light implanting steps, formation of spacers, and heavy source and drain implantations, also for the LDD transistors.

However, the gate regions of the ROM cell transistors are defined at a later stage, and so are those of the EEPROM cells and the HV transistors.

Figure 2:
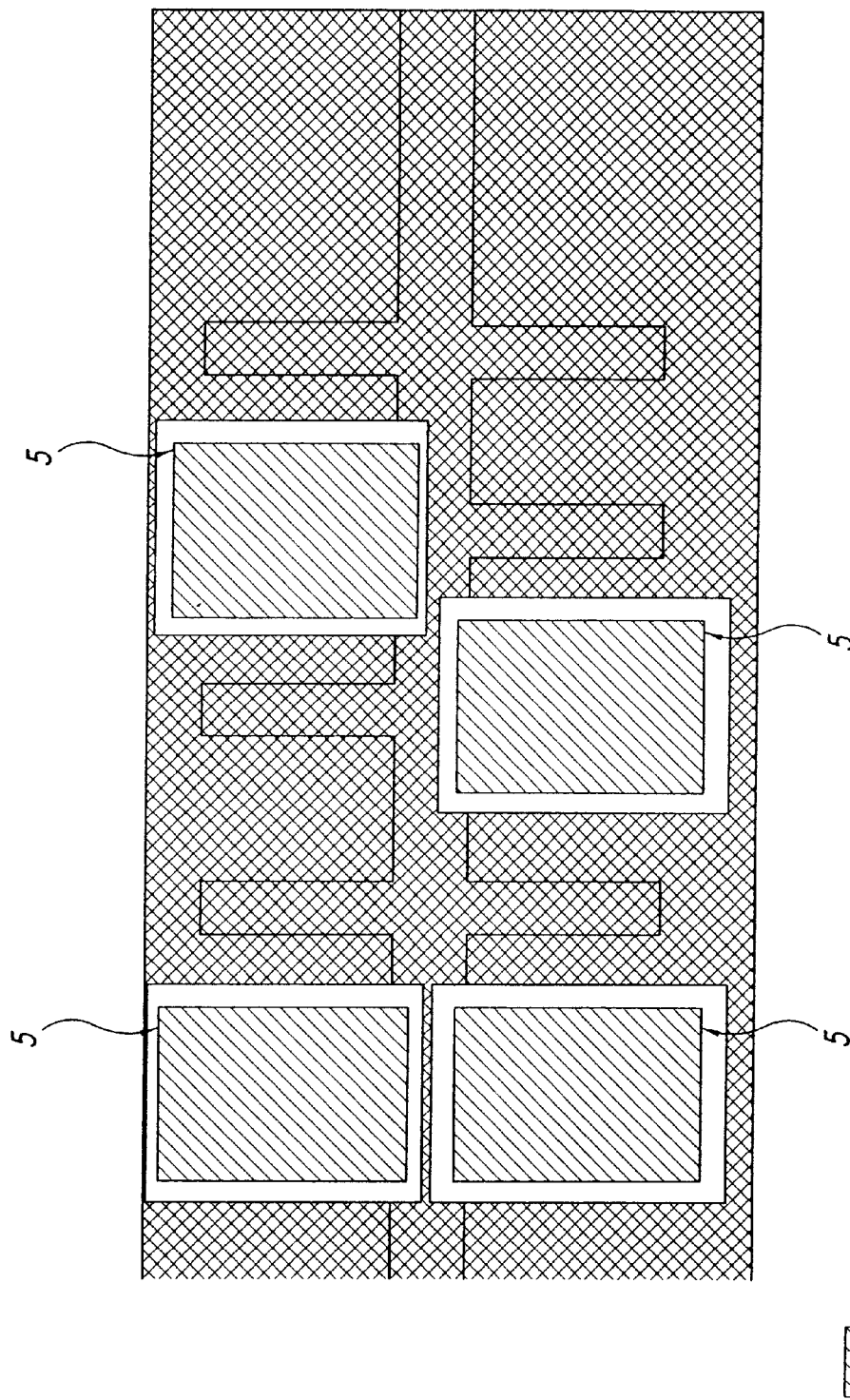
FIG. 2 is a layout view illustrating the same portion of the integrated circuit of FIG. 1, during a subsequent step.
Figure 3:
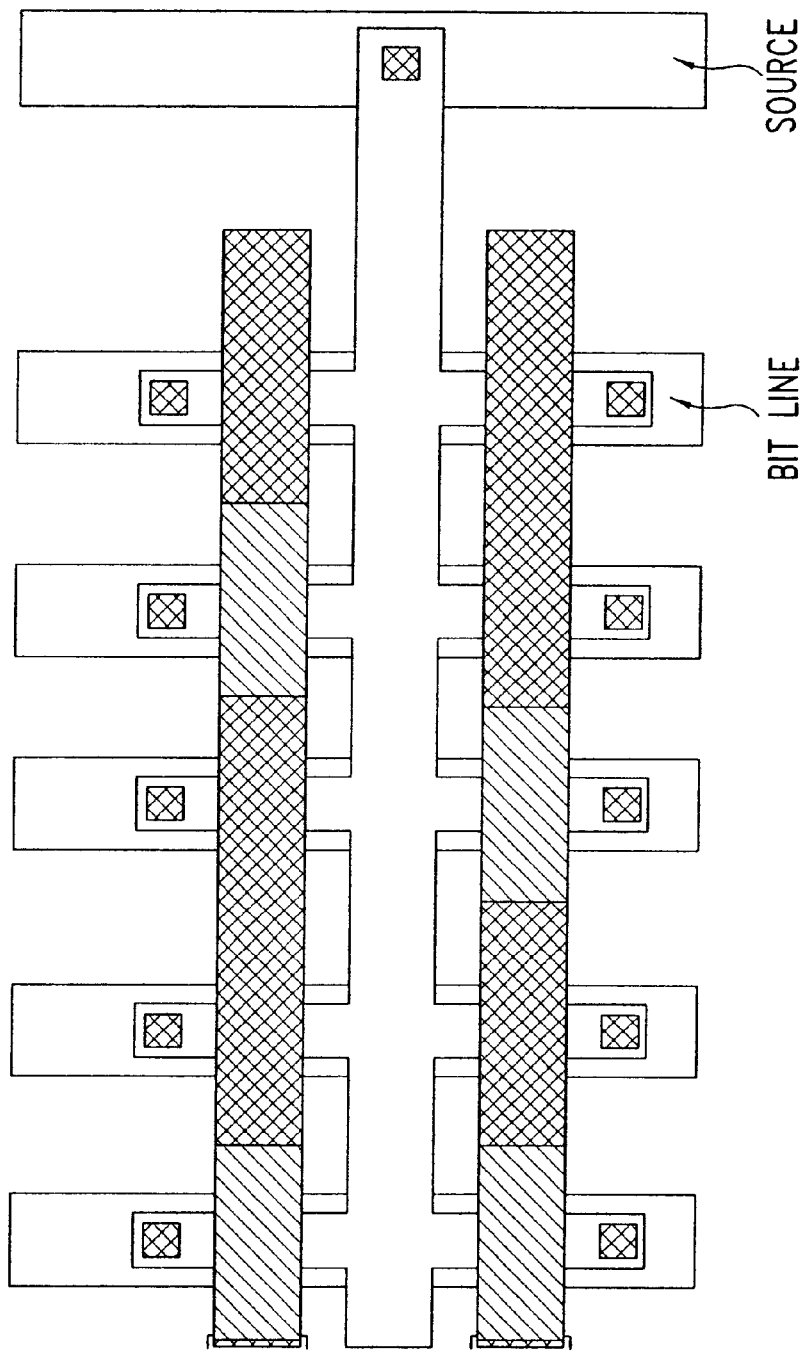
FIG. 3 is a layout view illustrating the same portion of the integrated circuit of FIGS. 1 and 2 during a further subsequent step.

During the source and drain n+ implanting step for the low-voltage transistors, certain ROM cells 1, such as those referenced 5 in FIG. 2, are masked such that their gate region layer of polysilicon can be subjected to a subsequent p+ dopant implanting step. This masking step essentially allows the logic state of the ROM cell to be programmed, and the mask can be regarded here as a program mask.

The above cells 5 will be exposed when the source and drain p+ implantation is to be carried out, whereas the cells previously implanted with the N+ dopant will be covered.

In essence, one step of the method provides for the polysilicon layer to be doped with N dopant, and a subsequent step provides for the same polysilicon layer to be doped with P dopant. During these implanting steps, the source and drain regions of the ROM cells 1 would be covered with the polysilicon layer and not implanted.

Thus, in the processing, two separate different dopings are provided for the polysilicon layer, which means that the process is a dual gate type wherein the gate is doped with the same dopant as the channel region of the cell. Furthermore, it is important in embodiments of the invention to have the source/drain implantation separated in time from the polysilicon implantation.

At the end of these process steps, the polysilicon layer of the matrix of ROM cells 1 will be doped in some areas with dopant of the N type, and in other areas with dopant of the P type. Accordingly, the polysilicon layer of the matrix of cells 1 with N-doped gates will exhibit a typical threshold, whereas the cells with P-doped gates will have a much higher threshold because of the different work function of the P-doped polysilicon from the N-doped polysilicon. This enables the first two logic levels of the inventive memory structure to be defined.

With an appropriate masking step and subsequent etching, the polysilicon layer of the matrix of cells 1 is then defined. By this etching, the HV transistors of the integrated circuit and the LV transistors forming the Flash EEPROM cells are also defined.

Further light source and drain implantations are provided for the matrix of ROM cells 1. During these implantations, a third logic level can be obtained by fully covering some cells, which will thus remain disconnected and carry no current under any bias conditions.

The result from these steps allows ROM cells to be produced with three logic levels each, in a dual gate process involving no more masks than are used in a standard process for making EEPROMs or Flash EEPROMs for smart cards.

The array of ROM cells is provided naturally with three logic levels per cell, which allows the information storage capacity of the ROM to be increased exponentially.

For example, with eight cells, this capacity is raised from $2^8=256$ codes to $3^8=6,561$ codes; with sixteen cells, it is raised from 65,536 codes to 43,046,721 different codes; etc.

The ROM cells are produced according to embodiments of the invention by differentially doping the gates of the corresponding transistors, also in a dual gate process environment.

Of course, the memory structure of this invention would require dedicated sensing circuitry for decrypting the logic information contained at the three levels of each cell by translating it from ternary to binary logics. However, this represents no significant disadvantage when the increase in storage capacity is considered. A further advantage of this three-level design is that ternary logics would make it even more difficult to grasp the information stored, or better, encrypted, in the memory structure of embodiments of this invention.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A ROM structure having ROM cells integrated in a semiconductor by a dual gate CMOS process along with electrically erasable non-volatile memory cells and low- and high-voltage transistors, all cells and transistors having active areas covered with a layer of polysilicon, wherein a first group of the ROM cells have their polysilicon layer doped with a first type of dopant, thereby producing ROM cells of a first logic state and a second group of the ROM cells have their polysilicon layer doped with a second type of dopant, thereby producing ROM cells of a second logic state.

2. A ROM structure comprising:
   first ROM memory cells integrated in a semiconductor layer having a polysilicon layer doped with a first type of dopant and having a first threshold voltage;

second ROM memory cells integrated in the semiconductor layer having a polysilicon layer doped with a second type of dopant and having a second threshold voltage;

third ROM memory cells integrated in the semiconductor layer that are permanently non-conductive;

electrically erasable non-volatile memory cells integrated in the semiconductor layer;

low-voltage transistors integrated in the semiconductor layer; and high-voltage transistors integrated in the semiconductor layer.

3. A ROM structure comprising:

first ROM memory cells integrated in a semiconductor layer having a polysilicon layer doped with a first type of dopant and having a first threshold voltage;

second ROM memory cells integrated in the semiconductor layer having a polysilicon layer doped with a second type of dopant and having a second threshold voltage; and third ROM memory cells integrated in the semiconductor layer that are non-operative when coupled to standard operating voltages for memory cells.

4. The ROM structure of claim 3 wherein the first and second ROM cells each have doped source and drain regions and the ROM cells do not have doped source and drain regions.

5. The ROM structure of claim 3, further comprising electrically erasable non-volatile memory cells integrated in the semiconductor layer.

6. A ROM structure having ROM cells integrated in at semiconductor, comprising:

a first group of the ROM cells each having a gate region layer doped with a first type of dopant, thereby producing ROM cells of a first logic state;

a second group of the ROM cells each having a gate region layer doped with a second type of dopant, thereby producing ROM cells of a second logic state; and a third group of ROM cells that are permanently non-conductive.

7. The ROM structure of claim 6 wherein the gate region layers are polysilicon layers.

* * * * *

UNITED STATES PATENT AND TRADEMARK OFFICE
CERTIFICATE OF CORRECTION

PATENT NO.     : 6,521,957 B2
DATED          : February 18, 2003
INVENTOR(S)    : Matteo Patelmo et al.

It is certified that error appears in the above-identified patent and that said Letters Patent is hereby corrected as shown below:

Column 4,
Line 63, after "state" should read as -- ; and wherein the ROM cells of the first and second groups each have doped source and drain regions, the ROM structure further comprising a third group of the ROM cells that do not have doped source and drain regions, thereby producing ROM cells of a third logic state. --.

Column 5,
Lines 22 and 23, "that are non-operative when coupled to standard operating voltages for memory cells." should read as -- that are permanently non-conductive. --.

Column 6,
Lines 8 and 9, "in at semiconductor," should read as -- in a semiconductor, --.

Signed and Sealed this

Twenty-fourth Day of June, 2003

JAMES E. ROGAN
*Director of the United States Patent and Trademark Office*